United States Patent
Kim

(10) Patent No.: US 10,705,746 B2
(45) Date of Patent: Jul. 7, 2020

(54) MEMORY SYSTEM AND OPERATING METHOD THEREOF

(71) Applicant: SK hynix Inc., Gyeonggi-do (KR)

(72) Inventor: Kwang Su Kim, Gyeonggi-do (KR)

(73) Assignee: SK hynix Inc., Gyeongggi-do (KR)

( * ) Notice: Subject to any disclaimer, the term of this patent is extended or adjusted under 35 U.S.C. 154(b) by 33 days.

(21) Appl. No.: 16/031,627

(22) Filed: Jul. 10, 2018

(65) Prior Publication Data
US 2019/0187923 A1    Jun. 20, 2019

(30) Foreign Application Priority Data
Dec. 18, 2017  (KR) .................. 10-2017-0174488

(51) Int. Cl.
| | |
|---|---|
| *G06F 3/06* | (2006.01) |
| *G11C 7/10* | (2006.01) |
| *G11C 8/12* | (2006.01) |
| *G11C 16/10* | (2006.01) |
| *G11C 16/04* | (2006.01) |
| *G11C 29/04* | (2006.01) |

(52) U.S. Cl.
CPC ............ *G06F 3/0634* (2013.01); *G06F 3/061* (2013.01); *G06F 3/064* (2013.01); *G06F 3/0659* (2013.01); *G06F 3/0679* (2013.01); *G11C 7/1045* (2013.01); *G11C 8/12* (2013.01); *G11C 16/0483* (2013.01); *G11C 16/10* (2013.01); *G11C 2029/0411* (2013.01); *G11C 2211/5641* (2013.01)

(58) Field of Classification Search
CPC ........ G06F 3/0634; G06F 3/061; G06F 3/064; G06F 3/0659; G06F 3/0679; G11C 16/0483; G11C 16/10
See application file for complete search history.

(56) References Cited

U.S. PATENT DOCUMENTS

| | | | | |
|---|---|---|---|---|
| 7,234,049 B2 * | 6/2007 | Choi | ..................... | G06F 9/4401 235/492 |
| 2002/0075529 A1 * | 6/2002 | Sato | ................... | H04N 1/00236 358/505 |
| 2004/0254013 A1 * | 12/2004 | Quraishi | ................. | G07F 17/32 463/29 |
| 2005/0208967 A1 * | 9/2005 | Buniatyan | .......... | G06F 11/1456 455/557 |

(Continued)

FOREIGN PATENT DOCUMENTS

| | | |
|---|---|---|
| KR | 100399603 | 9/2003 |
| KR | 101342828 | 12/2013 |

OTHER PUBLICATIONS

Texas Instruments, Secure In-Field Firmware Updates for MSP MCUs, Nov. 2015 (Year: 2015).*

(Continued)

*Primary Examiner* — Ryan Bertram
(74) *Attorney, Agent, or Firm* — IP & T Group LLP

(57) ABSTRACT

A memory system includes: a controller for selecting a pre-coding mode or a normal write mode in response to a host interface mode change command inputted from a host device; and a semiconductor memory device for storing, in an operating system (OS) storage area, OS data inputted from the host device in the pre-coding mode under the control of the controller.

16 Claims, 7 Drawing Sheets

(56) References Cited

U.S. PATENT DOCUMENTS

| | | | | |
|---|---|---|---|---|
| 2006/0224821 A1* | 10/2006 | Chen | ........................ | G06F 8/654 |
| | | | | 711/103 |
| 2007/0045426 A1* | 3/2007 | Shiota | ................. | G06F 13/4239 |
| | | | | 235/492 |
| 2009/0300273 A1* | 12/2009 | Chen | ................... | G06F 13/1694 |
| | | | | 711/103 |
| 2012/0198131 A1* | 8/2012 | Tan | ..................... | G06F 12/0246 |
| | | | | 711/103 |
| 2014/0082405 A1* | 3/2014 | Lee | ........................... | G06F 1/04 |
| | | | | 713/600 |
| 2015/0032913 A1* | 1/2015 | Kim | ........................ | G06F 13/28 |
| | | | | 710/24 |
| 2019/0095117 A1* | 3/2019 | Park | ...................... | G06F 3/0634 |

OTHER PUBLICATIONS

Cypress, eMMC Field Firmware Update (FFU) Feature, Nov. 2015 (Year: 2015).*

* cited by examiner

MEMORY SYSTEM AND OPERATING METHOD THEREOF

CROSS-REFERENCE TO RELATED APPLICATION

The present application claims priority under 35 U.S.C. § 119(a) to Korean patent application number 10-2017-0174488, filed on Dec. 18, 2017, which is incorporated herein by reference in its entirety.

BACKGROUND

1. Field of Invention

An aspect of the present disclosure relates to a memory system and an operating method thereof, and particularly, to a memory system capable of enabling or disabling a pre-coding mode, based on a host interface mode, and an operating method of the memory system.

2. Description of the Related Art

The paradigm on recent computer environment may have been turned into ubiquitous computing environment in which it is possible to use computing systems anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device may have excellent stability and durability, high information access speed, and low power consumption, since there is no mechanical driving part. As an example of memory systems having such advantages, the data storage device includes a universal serial bus (USB) memory device, memory cards having various interfaces, a solid-state drive (SSD), and the like.

SUMMARY

Embodiments provide a memory system capable of easily enabling or disabling a pre-coding mode, based on a host interface mode, and an operating method of the memory system.

In accordance with an aspect of the present disclosure, there is provided a memory system including: a controller for selecting a pre-coding mode or a normal write mode in response to a host interface mode change command inputted from a host device; and a semiconductor memory device for storing, in an operating system (OS) storage area, OS code data inputted from the host device in the pre-coding mode under the control of the controller.

In accordance with another aspect of the present disclosure, there is provided a method for operating a memory system, the method including: selecting a host interface mode in response to the host interface mode change command inputted from a host device; selecting a pre-coding mode or a normal write mode according to the host interface mode change command; and storing data inputted from the host device in a semiconductor memory device in the pre-coding mode or the normal write mode.

In accordance with an aspect of the present disclosure, there is provided a memory system including: a memory device having an operating system (OS) region and a normal region; a controller suitable for: selecting one between first and second modes in response to a mode request; receiving OS code data in a lower operation speed during the first mode while receiving the other data in a higher operation speed during the second mode; and controlling the memory device to store the OS code data into the OS region during the first mode and to store other data into the normal region during the second mode, wherein the controller, when the OS region is substantially full of data, controls the memory device to store the OS code data into the normal region during the first mode

BRIEF DESCRIPTION OF THE DRAWINGS

Example embodiments of the present invention will now be described more fully hereinafter with reference to the accompanying drawings; however, we note that the present invention may be embodied in different forms and should not be construed as limited to the embodiments set forth herein. Rather, these embodiments are provided so that this disclosure of the invention will be thorough and complete, and will fully convey the scope of the example embodiments to those skilled in the art.

We further note that in the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Also, as used herein, the term "and/or" includes any and all combinations of one or more of the associated listed items.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
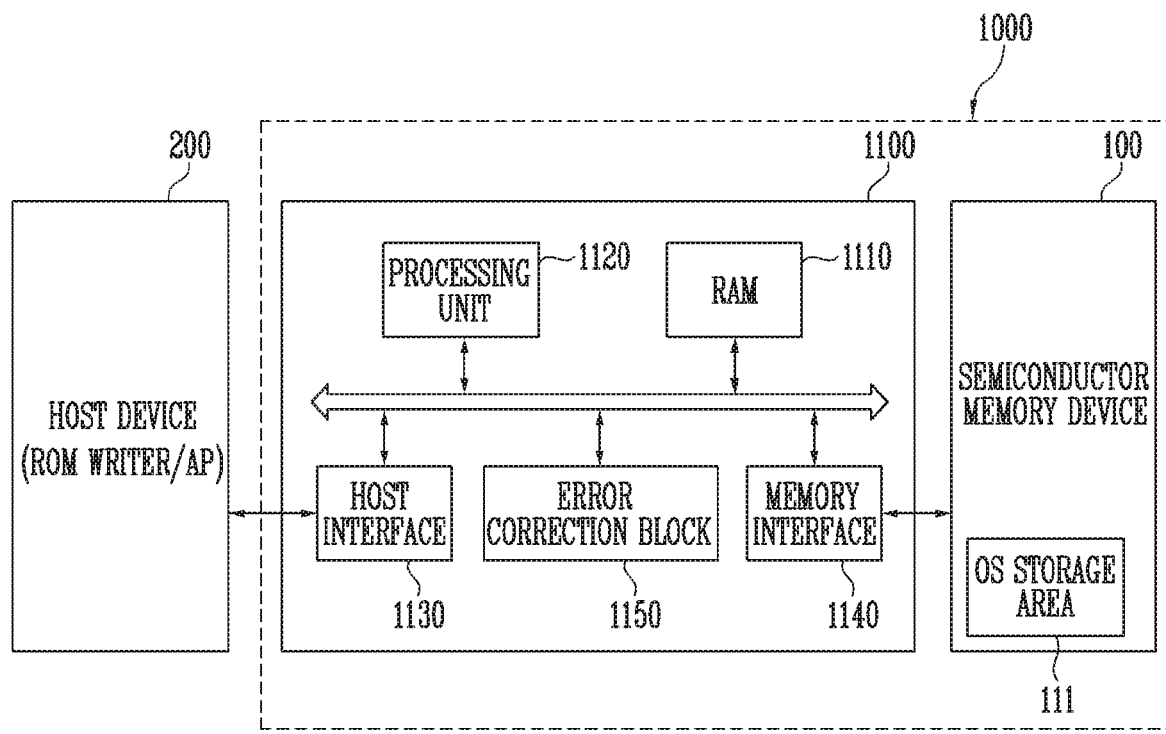
FIG. 1 is a block diagram illustrating a memory system in accordance with an embodiment of the present disclosure.

FIG. 1 is a block diagram illustrating a memory system 1000 in accordance with an embodiment of the present disclosure.

Referring to FIG. 1, the memory system 1000 includes a semiconductor memory device 100 and a controller 1100.

The semiconductor memory device 100 performs a read, write, erase, and background operations under the control of the controller 1100. The semiconductor memory device 100 includes a plurality of memory blocks, and at least one memory block among the plurality of memory blocks may be defined as an operating system (hereinafter, referred to as OS) storage area 111 for storing OS code data. In this case, the other memory blocks except the OS storage area 111 among the plurality of memory blocks may be defined as normal memory blocks. For example, the memory blocks included in the OS storage area 111 may be defined as memory blocks that are programmed and read using a single level cell (SLC) method, and the normal memory blocks may be defined as memory blocks that are programmed and read using a multi-level cell (MLC), triple level cell (TLC), or quad level cell (QLC) method.

The controller 1100 is coupled to a host device 200 and the semiconductor memory device 100. The controller 1100 may be configured to access the semiconductor memory device 100 in response to a request from the host device 200. For example, the controller 1100 may be configured to control the read, write, erase, and background operations of the semiconductor memory device 100. The controller 1100 may be configured to provide an interface between the semiconductor memory device 100 and the host device 200. The controller 1100 may be configured to drive firmware for controlling the semiconductor memory device 100.

The memory system 1000 may operate in a pre-coding mode when OS code data is programmed in the OS storage area 111 of the semiconductor memory device 100. The memory system 1000 may change a host interface mode in response to a host interface mode change command inputted from the host device 200, and program OS code data or program normal data by determining whether to operate in the pre-coding mode or a normal write mode according to the host interface mode conversion command.

A host interface mode may be one of a plurality of interface modes categorized based on their data transmission speeds. For example, a host interface mode may be a high-speed mode, an HS 200 mode, an HS 400 mode, and the like. T high speed mode may have a maximum data transmission speed of 52 megabytes/sec, the HS 200 mode may have a maximum data transmission speed of 200 megabytes/sec, and the HS 400 mode may have a maximum data transmission speed of 400 mega bytes/sec.

In an embodiment of the present disclosure, in the pre-coding mode in which OS code data is programmed, the memory system 1000 operates in a host interface mode having a data transmission speed slower than a set data transmission speed. In the normal write mode in which normal data is programmed, the memory system 1000 operates in a host interface mode having a data transmission speed faster than the set data transmission speed. For example, in the pre-coding mode, the memory system 1000 may operate in the high-speed mode while in the normal write mode, the memory system 1000 may operate in the HS 200 mode or the HS 400 mode, which have a data transmission mode faster than that of the high speed mode.

In accordance with an embodiment of the present disclosure, the controller 1100 may select an initial host interface mode. The selection of the initial host interface mode may be performed based on a host interface mode selection command received from the host 200. Alternatively, the selection of the initial host interface mode may be performed when the memory system is powered on based on a default command. For example, the initial host interface mode may be the high-speed mode for operating in the pre-coding mode when the memory system 1000 is powered on. Then, in response to a host interface mode change command received from the host 200, the controller 1100 may maintain the initial host interface mode or change the host interface mode. For example, if the initial host interface mode is the high speed mode for operating in the pre-coding mode, upon receiving a host interface mode change command the controller 1100 may maintain the high speed mode as the host interface mode for continuing operating in the pre-coding mode or may change the host interface mode to the HS 200 mode or the HS 400 mode for operating in the normal write mode.

In an embodiment, the initial host interface mode is the high speed mode for operating in the pre-coding mode, when the host device 200 is a device for transmitting OS code data, e.g., a ROM writer, the controller 1100 maintains the host interface mode as the high speed mode for the pre-coding mode in response to the host interface mode change command inputted from the host device 200. Then, OS code data inputted from the host device 200 is stored in the OS storage area 111 of the semiconductor memory device 100 under the control of the controller 1100 in the pre-coding mode. On the other hand, when the host device 200 is an application processor (hereinafter, referred to as AP), the controller 1100 changes the host interface mode from the high speed mode to the HS 200 mode or the HS 400 mode for the normal write mode in response to the host interface mode change command inputted from the host device 200. Then, normal data inputted from the host device 200 may be stored in the normal memory blocks of the semiconductor memory device 100 under the control of the controller 1100 in the normal write mode, or data stored in the normal memory blocks may be read and output to the host device 200.

According to the embodiment of FIG. 1, the controller 1100 may also include a random-access memory (RAM) 1110, a processing unit 1120, a host interface 1130, a memory interface 1140, and an error correction block 1150 operatively coupled via a bus.

The RAM 1110 may store firmware, and may be used as a working memory of the processing unit 1120, a cache memory between the semiconductor memory device 100 and the host device 200, and a buffer memory between the semiconductor memory device 100 and the host device 200.

An algorithm for performing overall operations may be included in the firmware. The RAM 1110 may store data processed by the controller 1100.

The processing unit 1120 may control the overall operations of the controller 1100. The processing unit 1120 may control a program, read, or erase operation of the semiconductor memory device 100. In an embodiment of the present disclosure, the processing unit 1120 may maintain or change the host interface mode according to a host interface mode change command inputted from the host device 200, and may control the semiconductor memory device 100 to operate in a pre-coding mode or a normal write mode according to the host interface mode change command.

The host interface 1130 may include a protocol for exchanging data between the host device 200 and the controller 1100. In an exemplary embodiment, the controller 1100 may be configured to communicate with the host device 200 through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface 1140 may include a NAND interface or a NOR interface.

The error correction block 1150 may be configured to detect and correct an error of data received from the semiconductor memory device 100 by using an error correction code (ECC). For example, the error correction block 1150 compares the bit number of a detected error with the maximum ECC bit number. When the bit number of the detected error is smaller than the maximum ECC bit number, the error correction block 1150 corrects the detected error.

The controller 1100 and the semiconductor memory device 100 may be integrated into one semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host device 200 coupled to the memory system 1000 can be remarkably improved.

As another example, the memory system 1000 may be provided as one of various components of an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 2:
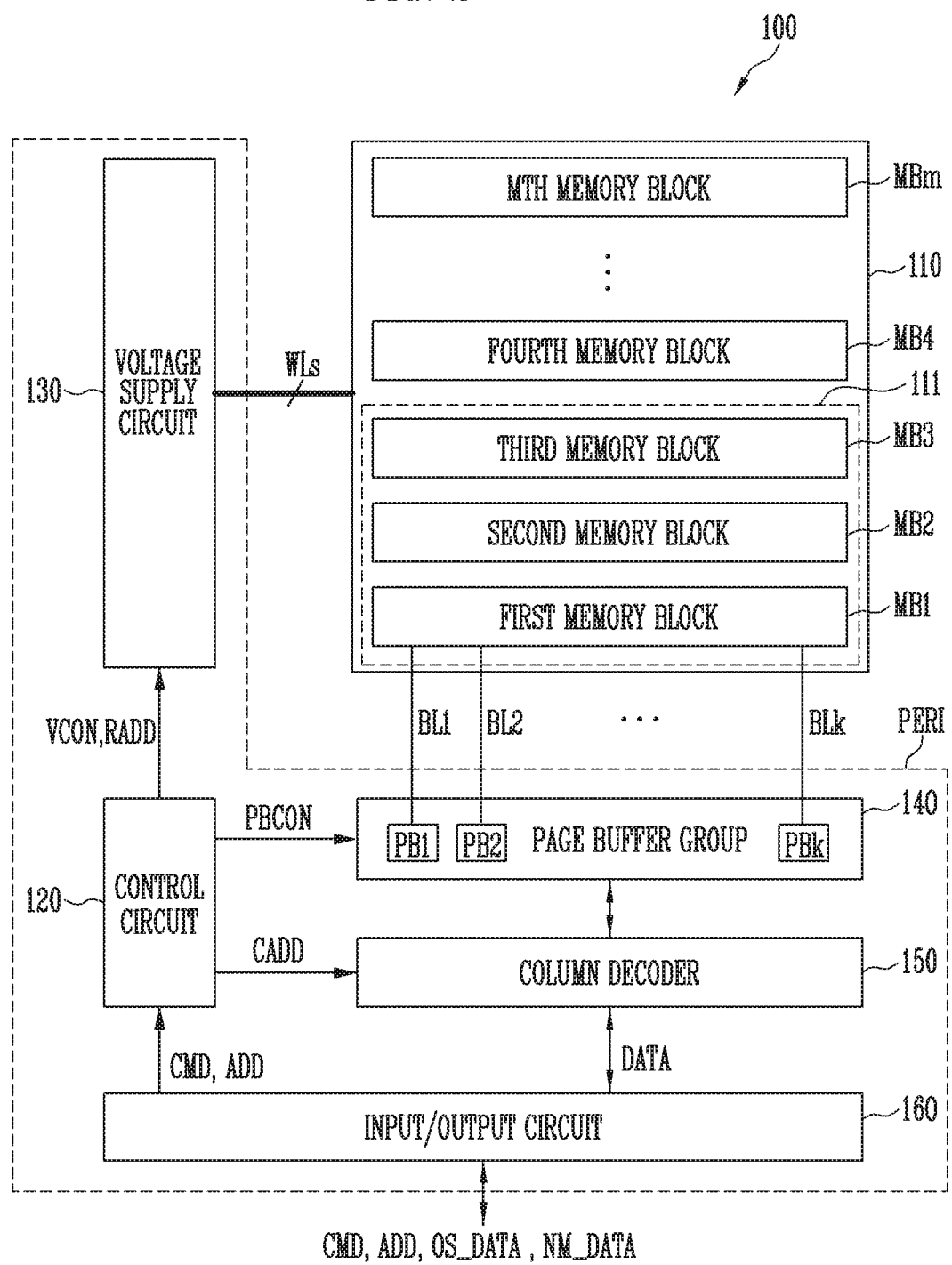
FIG. 2 is a block diagram illustrating an embodiment of a semiconductor memory device employed in the memory system of FIG. 1.

FIG. 2 is a block diagram illustrating an embodiment of the semiconductor memory device of FIG. 1.

Referring to FIG. 2, the semiconductor memory device 100 includes a memory cell array 110 including first to mth memory blocks MB1 to MBm, and a peripheral circuit PERI configured to perform program and read operations of memory cells included in a selected page of the memory blocks MB1 to MBm. The peripheral circuit PERI includes a control circuit 120, a voltage supply circuit 130, a page buffer group 140, a column decoder 150, and an input/output circuit 160.

Some memory blocks among the first to mth memory blocks MB1 to MBm included in the memory cell array 110 may be defined as an OS storage area 111. The OS storage area 111 may be configured to include at least one memory block. In the embodiment of the present disclosure, it is illustrated that the first to third memory blocks MB1 to MB3 are included in the OS storage area 111. The first to third memory blocks MB1 to MB3 included in the OS storage area 111 may store OS code data OS_DATA inputted from the host device 200 of FIG. 1 in the pre-coding mode. The first to third memory blocks MB1 to MB3 included in the OS storage area 111 may be defined as memory blocks that are read and programmed using the SLC method. Accordingly, the reliability of the OS code data OS_DATA stored in the first to third memory blocks MB1 to MB3 can be ensured, and a data program operation of the OS code data OS_DATA can be rapidly performed.

The other memory blocks MB4 to MBm except for the memory blocks of the OS storage area 111 among the first to mth memory blocks MB1 to MBm included in the memory cell array 110 may be defined as normal memory blocks. The normal memory blocks MB4 to MBm may store normal data NM_DATA inputted from the host device 200 in the normal write operation under the control of the controller 1100.

The control circuit 120 outputs a voltage control signal VCON for generating a voltage required to perform a program operation or a read operation in response to a command CMD input through the input/output circuit 160, and outputs a PB control signal PBCON for controlling page buffers PB1 to PBk included in the page buffer group 140 according to the kind of operation. Also, the control circuit 120 outputs a row address signal RADD and a column address signal CADD in response to an address signal ADD inputted from the outside through the input/output circuit 160.

The voltage supply circuit 130 supplies operating voltages required to perform program, read, and erase operations of memory cells in response to the voltage control signal VCON of the control circuit 120 to local lines including a drain select line, word lines WLs, and a source select line of a selected memory block. The voltage supply circuit 130 includes a voltage generating circuit and a row decoder.

The voltage generating circuit outputs operating voltages required to perform a program, read, or erase operation of memory cells to global lines in response to the voltage control signal VCON of the control circuit 120.

The row decoder connects the global lines and the local lines such that the operating voltages output to the global lines by the voltage generating circuit can be transferred to the local lines of the selected memory block in the memory cell array 110.

The page buffer group 140 includes a plurality of page buffers PB1 to PBk coupled to the memory cell array 110 respectively through bit lines BL1 to BLk. The page buffers PB1 to PBk of the page buffer group 140 selectively precharge the bit lines BL1 to BLk according to input data OS_DATA or NM_DATA so as to store the data OS_DATA or NM_DATA in the memory cells in response to the PB control signal PBCON of the control circuit 120, or sense voltages of the bit lines BL1 to BLk so as to read the data OS_DATA or NM_DATA from the memory cells.

The column decoder 150 selects the page buffers PB1 to PBk included in the page buffer group 140 in response to the column address signal CADD output from the control circuit 120. That is, the column decoder 150 sequentially transfers data OS_DATA or NM_DATA to be stored in the memory cells to the page buffers PB1 to PBk in response to the column address signal CADD. Also, the column decoder 150 sequentially selects the page buffers PB1 to PBk in response to the column address signal CADD such that data OS_DATA or NM_DATA of the memory cells, which are latched to the page buffers PB1 to PBk in a read operation, can be output to the outside.

In order to input, to the page buffer group 140, data OS_DATA or NM_DATA inputted from the host device 200 and the controller 1100 of FIG. 1 to be stored in the memory cells in a program operation, the input/output circuit 160 transfers the data OS_DATA or NM_DATA to the column decoder 150 under the control of the control circuit 120. If the column decoder 150 transfers the data OS_DATA or NM_DATA transferred from the input/output circuit 160 to the page buffers PB1 to PBk of the page buffer group 140, the page buffers PB1 to PBk store the input data OS_DATA or NM_DATA to latch circuits therein. Also, in a read operation, the input/output circuit 160 outputs, to the outside, the data OS_DATA or NM_DATA transferred from the page buffers PB1 to PBk of the page buffer group 140 through the column decoder 150.

Figure 3:
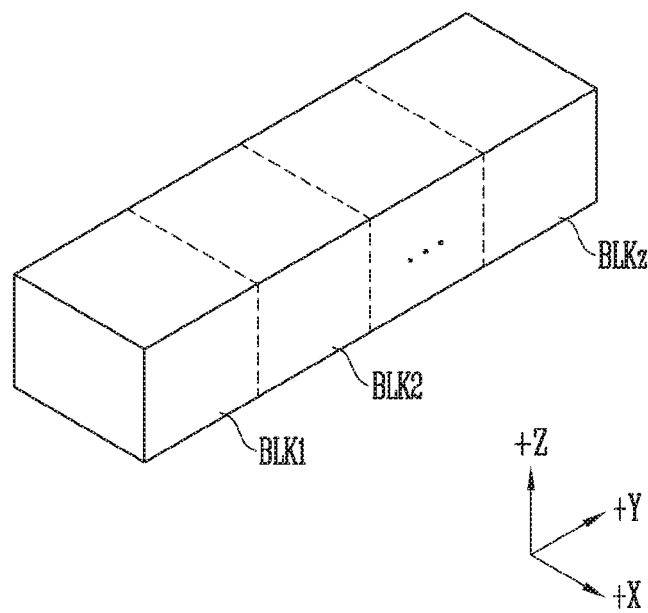
FIG. 3 is a block diagram illustrating an embodiment of a memory cell array employed in the semiconductor memory device of FIG. 2.

FIG. 3 is a block diagram illustrating an embodiment of the memory cell array 110 of FIG. 2.

Referring to FIG. 3, the memory cell array 110 includes a plurality of memory blocks BLK1 to BLKz. Each memory block may have a three-dimensional structure. Each memory block may include a plurality of memory cells stacked above a substrate. The plurality of memory cells may be arranged along +X, +Y, and +Z directions. An exemplary structure of each memory block will be described in more detail with reference to FIG. 4. However, it is noted that the structure of FIG. 4 is provided as an example and is not intended to limit the invention in any way.

Figure 4:
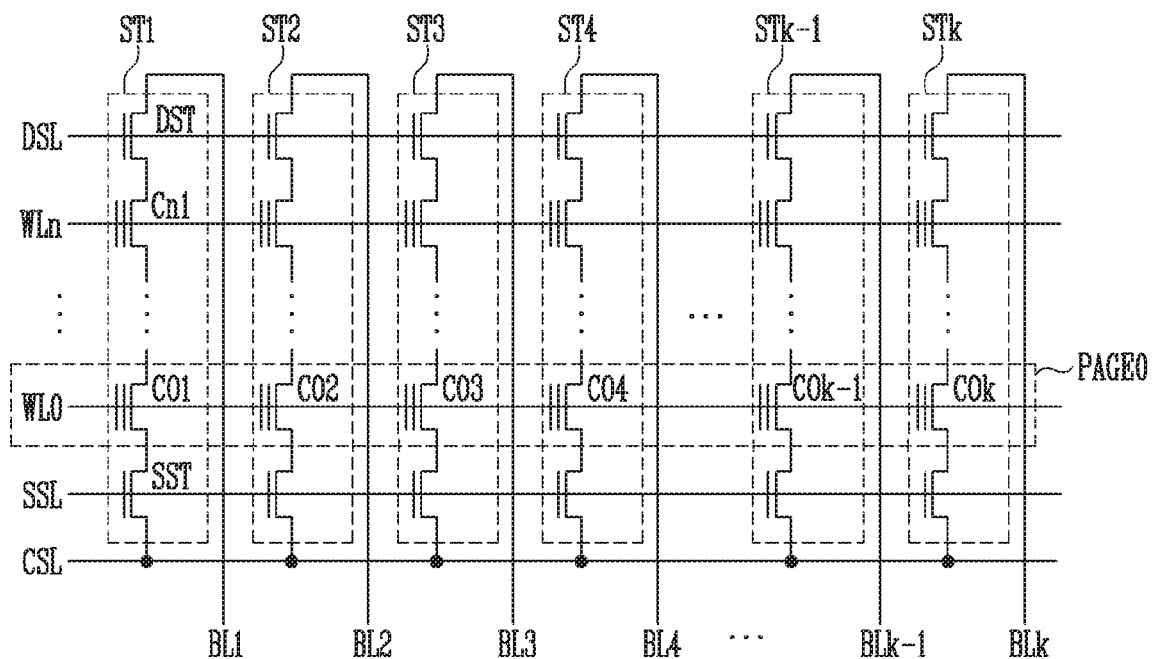
FIG. 4 is a circuit diagram illustrating an embodiment of a memory block of the memory cell array shown in FIG. 3.

FIG. 4 is a circuit diagram illustrating an embodiment of the memory block shown in FIG. 3.

Referring to FIG. 4, each memory block may include a plurality of strings ST1 to STk coupled between bit lines BL1 to BLk and a common source line CSL. The strings ST1 to STk may be coupled to corresponding bit lines BL1 to BLk, respectively, and may be commonly coupled to the common source line CSL. Each string ST1 may include a source select transistor SST having a source coupled to the common source line CSL, a plurality of memory cells C01 to Cn1, and a drain select transistor DST having a drain coupled to the bit line BL1. The memory cells C01 to Cn1 may be coupled in series between the select transistors SST and DST. A gate of the source select transistor SST may be coupled to a source select line SSL, gates of the memory cells C01 to Cn1 may be coupled to word lines WL0 to WLn, respectively, and a gate of the drain select transistor DST may be coupled to a drain select line DSL.

Memory cells included in a memory block may be divided in units of physical pages or logical pages. For example, the memory cells C01 to C0$k$ coupled to one word line (e.g., WL0) may constitute one physical page PAGE0. Such a page may become a basic unit of the program operation or the read operation.

Figure 5:
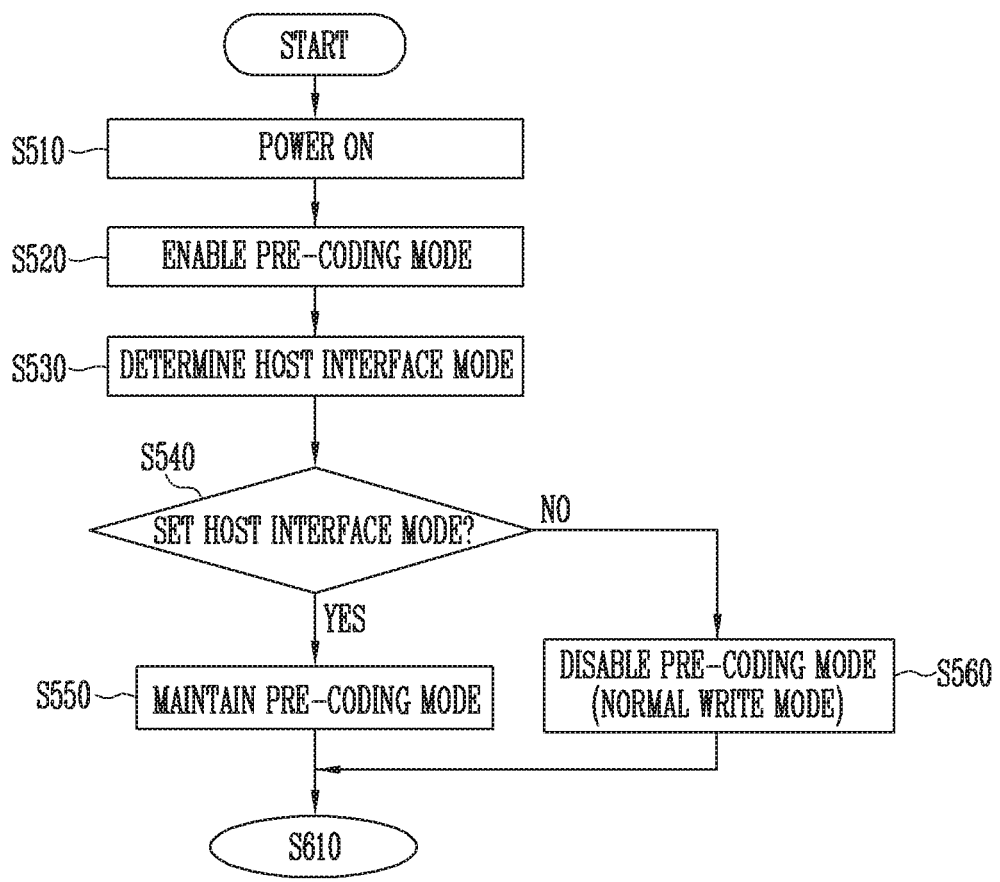
FIGS. 5 and 6 are flowcharts of an operating method of the memory system in accordance with an embodiment of the present disclosure.
Figure 6:
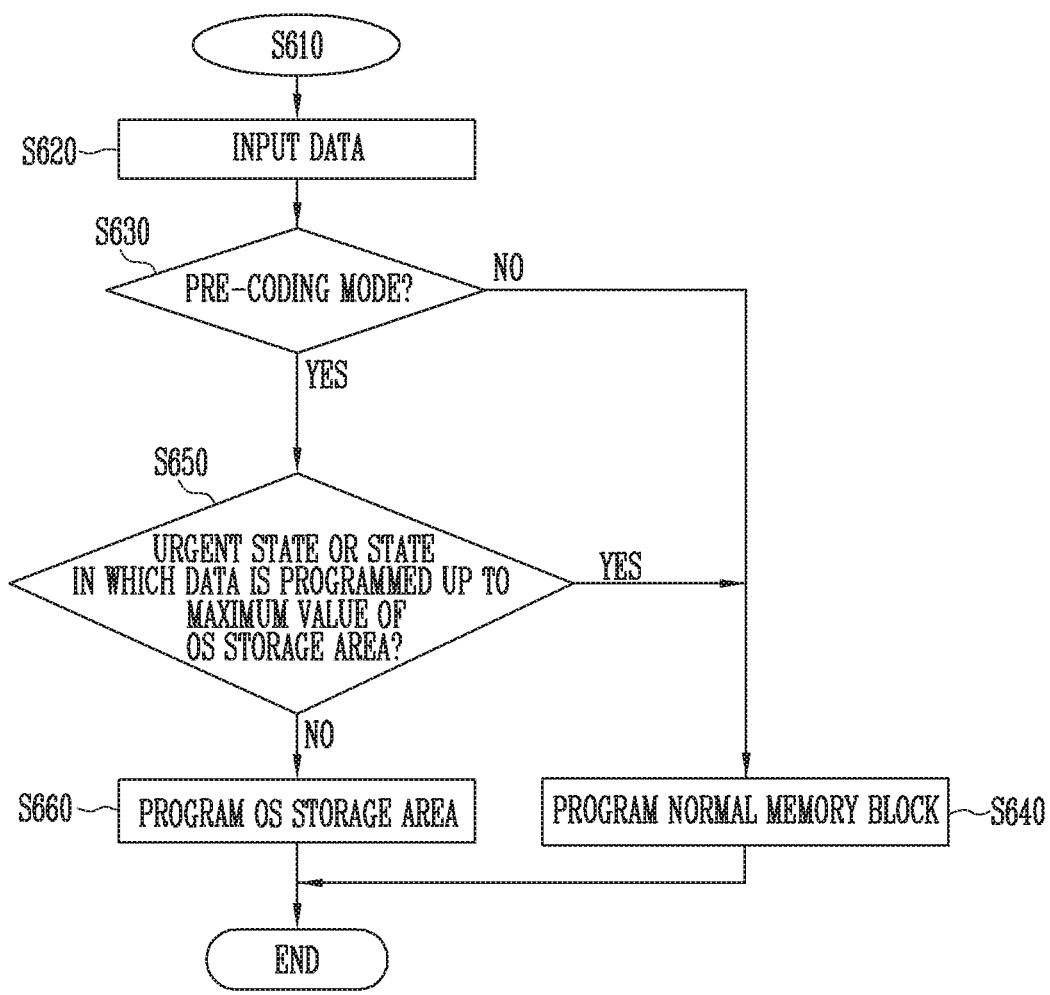

FIGS. 5 and 6 are flowcharts of an operating method of the memory system in accordance with an embodiment of the present disclosure.

Referring to FIGS. 1 to 6, the operating method of the memory system in accordance with an embodiment of the present disclosure will be described as follows.

If power is supplied to the memory system 1000, i.e., if the memory system 1000 is "power on" at step S510, the controller 1100 sets the memory system in an operation ready state by performing a booting operation.

The controller 1100 enables the pre-coding mode in which OS code data is stored during an initial setting operation at step S520. The initial setting operation may be part of the booting operation or may be performed immediately after the booting operation.

The host device 200 coupled to the memory system 1000 may output a command for changing a host interface mode to the controller 1100 of the memory system 1000. For example, when the host device 200 is a ROM writer for storing OS code data, the host device 200 may output a host interface mode change command to the controller 1100 for changing the host interface mode to the high speed mode. In another example, when the host device 200 is an application processor (AP), the host device 200 may output a host interface mode change command for changing the host interface mode to the HS 200 mode or the HS 400 mode to the controller 1100.

The controller 1100 may detect a currently set host interface mode in response to the host interface mode change command inputted from the host device 200 at step S530.

Also, the controller 1100 may determine whether the input host interface mode change command corresponds to the currently set host interface mode at step S540. For example, when the currently set host interface mode is the high speed mode for the pre-coding mode operation, the controller 1100 may determine whether the input host interface mode change command corresponds to the high speed mode or the HS 200 mode or the HS 400 mode for a normal write mode operation.

As a result of the determination of step S540, when the input host interface mode change command corresponds to the currently set high speed mode for the pre-coding mode operation ("YES" at step S540), the controller 1100 at step S550 maintains the pre-coding mode enabled during the initial setting operation.

On the other hand, as a result of the determination of step S540, when the input host interface mode change command corresponds to the HS 200 mode or the HS 400 mode instead of the currently set high speed mode ("NO" at step S540), the controller 1100 at step S560 disables the pre-coding mode enabled during the initial setting operation.

After this, the operating method proceeds to step S610.

As described above, in accordance with an embodiment of the present disclosure, the memory system 1000 enables the pre-coding mode during the initial setting operation, and then maintains or disables the enabled pre-coding mode based on the currently set host interface mode while changing the host interface mode in response to the host interface mode change command inputted from the host device 200. That is, the operation mode of the memory system 1000 is set by immediately determining whether the host device 200 is a ROM writer or an application processor (AP) according to a host interface mode change command.

Hence, after an initial set up, the pre-coding mode may be maintained or disabled as the operation mode of the memory system 1000 according to a host interface mode change command and then the operating method proceeds to a next step from the step S610.

In operation, when data is inputted from the host device 200 at step S620, the controller 1100 may store temporarily the data in the RAM 1110, and the processing unit 1120 of the controller 1100 may determine whether the host interface mode is a pre-coding mode or a normal write mode, based on whether the pre-coding mode is in the enable or disable state at step S630. When the pre-coding mode is in the enable state, the data stored in the RAM 1110 is determined as OS code data OS_DATA. When the pre-coding mode is in the disable state, the data stored in the RAM 1110 is determined as normal data NM_DATA.

When it is determined that the host interface mode is in a normal write mode because the pre-coding mode is in the disable state ("NO" at step S630, the controller 1100 transmits the normal data NM_DATA which are temporarily stored in the RAM 1110 to the semiconductor memory device 100, and controls the semiconductor memory device 100 such that the transmitted normal data NM_DATA is stored in one or more of the normal memory blocks MB4 to MBm of the semiconductor memory device 100 at step S640.

When it is determined that the host interface mode is in a pre-coding mode, i.e., when the pre-coding mode is in the enable state ("YES" at step S630, the controller 1100 at step S650 may determine whether the OS storage area 111 of the semiconductor memory device 100 is in an urgent state that requires a garbage collection operation, etc., as the number of free blocks as empty spaces of the OS storage area 111 of the semiconductor memory device 100 is a set number or less, or whether the OS storage area 111 of the semiconductor memory device 100 is in a state in which data may be programmed up to the maximum value of the OS storage area 111.

As a result of the determination at step S650, when it is determined that the OS storage area 111 of the semiconductor memory device 100 is in the urgent state that requires the garbage collection operation or in the state in which the data is programmed up to the maximum value of the OS storage area 111 ("YES"), the controller 1100 may determine that the OS code data OS_DATA temporarily stored in the RAM 1110 cannot be programmed in the OS storage area 111, and controls the semiconductor memory device 100 such that the OS code data OS_DATA is stored in the normal memory blocks MB4 to MBm of the semiconductor memory device 100 in the normal write mode operation at step S640.

As a result of the determination at step S650, when it is determined that the OS storage area 111 of the semiconductor memory device 100 is not in the urgent state that requires the garbage collection operation and is not in the state in which the data is programmed up to the maximum value of the OS storage area 111 ("NO"), the controller 1100 programs the OS code data OS_DATA temporarily stored in the RAM 1110 in the OS storage area 111 at step S660.

Figure 7:
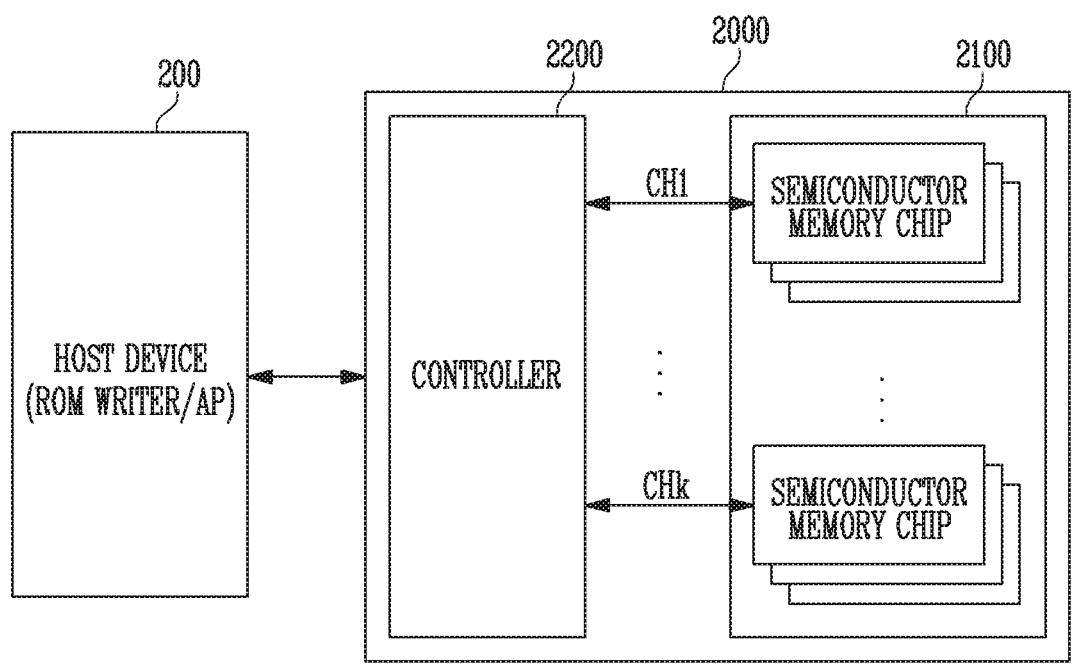
FIG. 7 is a block diagram illustrating an application example of the memory system of FIG. 1.

FIG. 7 is a block diagram illustrating an application example of the memory system of FIG. 1.

Referring to FIG. 7, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 7, it is illustrated that the plurality of groups may communicate with the controller 2200 through dedicated first to kth channels CH1 to CHk. Each semiconductor memory chip may be configured and operated identically to the semiconductor memory device 100 described with reference to FIGS. 1 to 6.

Each group may be configured to communicate with the controller 2200 through one common channel. The controller 2200 may be configured identically to the controller 1100 described with reference to FIG. 1. The controller 2200 may be configured to control the plurality of memory chips of the semiconductor memory device 2100 through the plurality of channels CH1 to CHk.

Figure 8:
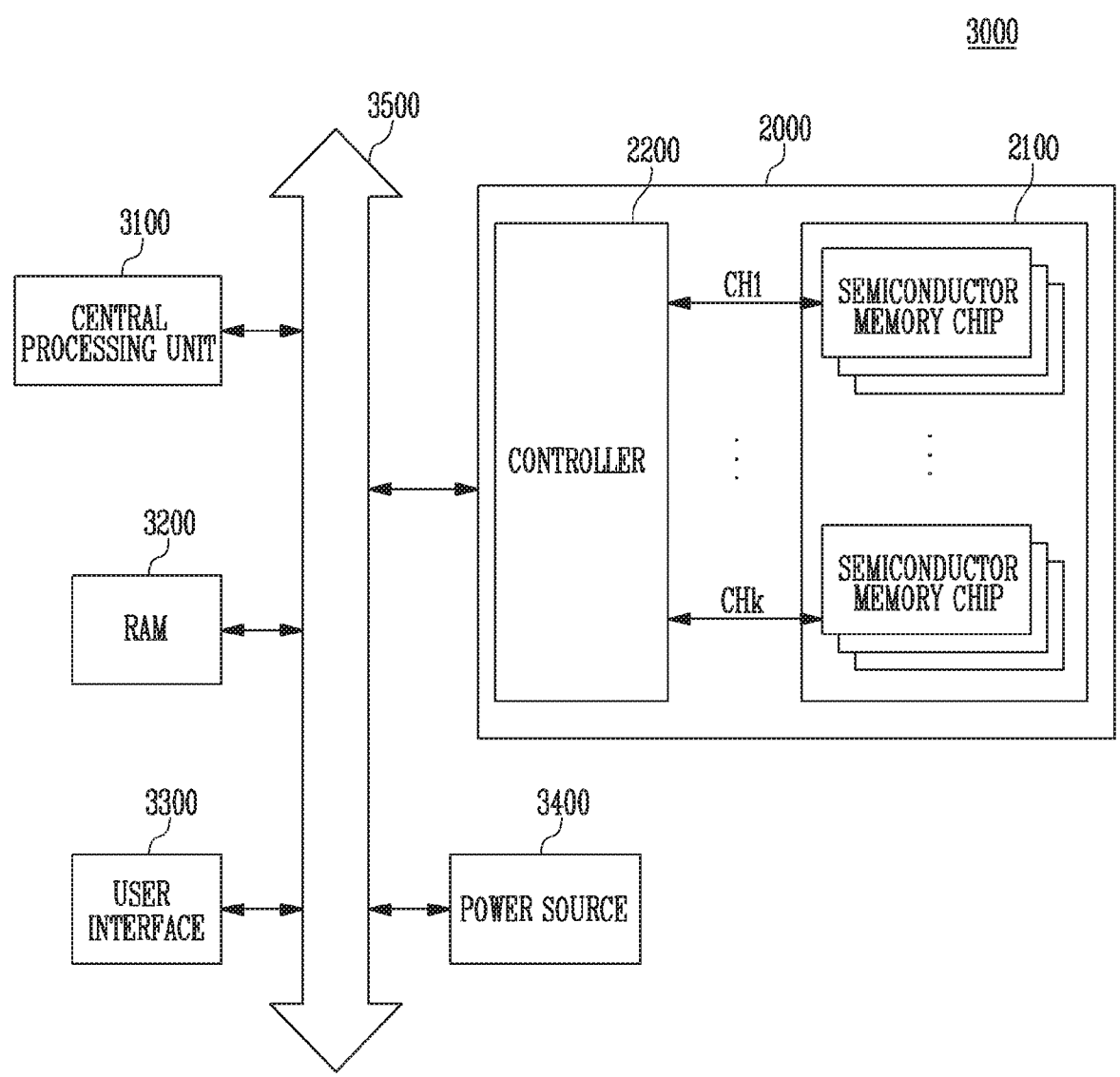
FIG. 8 is a block diagram illustrating an embodiment of a computing system including the memory system described with reference to FIG. 7.

FIG. 8 is a block diagram illustrating a computing system 300 including the memory system 2000 described with reference to FIG. 7.

Referring to FIG. 8, the computing system 300 may include a central processing unit 3100, a RAM 3200, a user interface 3300, a power source 3400, a system bus 3500, and the memory system 2000.

The memory system 2000 may be electrically coupled to the central processing unit 3100, the RAM 3200, the user interface 3300, and the power source 3400 through the system bus 3500. Data supplied through the user interface 3300 or data processed by the central processing unit 3100 may be stored in the memory system 2000.

In FIG. 8, it is illustrated that the semiconductor memory device 2100 is coupled to the system bus 3500 through the controller 2200. However, the semiconductor memory device 2100 may be directly coupled to the system bus 3500, in which case, the function of the controller 2200 may be performed by the central processing unit 3100 and the RAM 3200.

In FIG. 8, it is illustrated that the memory system 2000 which is described with reference to FIG. 7 is provided. However, the memory system 2000 may be replaced by the memory system 1000 described with reference to FIG. 1. In an exemplary embodiment, the computing system 3000 may be configured to include both the memory systems 1000 and 2000 described with reference to FIGS. 1 and 7.

In accordance with an embodiment of the present disclosure, in a pre-coding operation of storing OS code data during an operation of the memory system, the pre-coding mode is enabled or disabled based on the host interface mode, so that the memory system can be efficiently operated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art to which the present invention pertains that various changes in form and details may be made without departing from the spirit and scope of the present disclosure as set forth in the following claims.

What is claimed is:

1. A memory system comprising:
    a controller configured to change a host interface mode for communicating with a host device in response to a host interface mode change command inputted from the host device and to select a pre-coding mode or a normal write mode in response to the host interface mode change command; and
    a semiconductor memory device configured to store, in an operating system (OS) storage area, OS code data inputted from the host device in the pre-coding mode under the control of the controller,
    wherein the controller enables the pre-coding mode in initial setting, and maintains a state of the pre-coding mode during an initial setting operation as an enable state when the host interface mode change command corresponds to a high-speed mode.

2. The memory system of claim 1, wherein the host device includes a ROM writer or an application processor.

3. The memory system of claim 2, wherein the controller operates in the pre-coding mode or the normal write mode by determining whether the host device is the ROM writer or the application processor according to the host interface mode change command.

4. The memory system of claim 2, wherein the ROM writer outputs, to the controller, the host interface mode change command corresponding to the high-speed mode, and
    the application processor outputs, to the controller, the host interface mode change command corresponding to an HS 200 mode or an HS 400 mode.

5. The memory system of claim 4, wherein, when the host interface mode change command corresponds to the HS 200 mode or the HS 400 mode, the controller disables the state of the pre-coding mode during the initial setting operation.

6. The memory system of claim 1, wherein, the controller:
    maintains the state of the pre-coding mode during the initial setting operation as the enable state when the host interface mode corresponding to the host interface mode change command is a first host interface mode having a data transmission speed slower than a set data transmission speed; and
    disables the state of the pre-coding mode during the initial setting operation when the host interface mode corresponding to the host interface mode change command is a second host interface mode having a data transmission speed faster than the set data transmission speed.

7. The memory system of claim 6, wherein the controller operates in the pre-coding mode when the host interface mode change command corresponds to the first host interface mode, and operates in the normal write mode when the host interface mode change command corresponds to the second host interface mode.

8. The memory system of claim 7, wherein the semiconductor memory device includes the OS storage area for storing data and a plurality of normal memory blocks,
    wherein normal data inputted from the host device is stored in the plurality of normal memory blocks in the normal write mode.

9. The memory system of claim 8, wherein, when an empty space of the OS storage area is insufficient in the pre-coding mode, the controller may store the OS code data in the plurality of normal memory blocks.

10. The memory system of claim 8, wherein memory blocks included in the OS storage area are memory blocks that are programmed and read using a single level cell (SLC) method, and
    the normal memory blocks are memory blocks that are programmed and read using a multi-level cell (MLC), triple level cell (TLC), or quad level cell (QLC) method.

11. A method for operating a memory system, the method comprising:
    selecting a host interface mode for communicating with a host device in response to a host interface mode change command inputted from the host device;
    selecting a pre-coding mode or a normal write mode according to the host interface mode change command; and
    storing data inputted from the host device in a semiconductor memory device in the pre-coding mode or the normal write mode,
    wherein the semiconductor memory device includes a plurality of memory blocks, and some memory blocks among the plurality of memory blocks are defined as an OS storage area for storing OS code data in the pre-coding mode, and the other memory blocks except the OS storage area among the plurality of memory blocks are defined as normal memory blocks, and
    wherein, when a number of empty memory blocks of the OS storage area is insufficient in the pre-coding mode, the OS code data is stored in the normal memory blocks.

12. The method of claim 11, wherein the host device is a ROM writer for programming OS code data in the semiconductor memory device or an application processor for storing or reading normal data in or from the semiconductor memory device.

13. The method of claim 12, wherein, when the host device is the ROM writer, the OS code data is stored in the semiconductor memory device in the pre-coding mode, and when the host device is the application processor, the normal data is stored in the semiconductor memory device in the normal write mode.

14. The method of claim 11, wherein, in the selecting of the pre-coding mode or the normal write mode,
    the pre-coding mode is selected when the host interface mode corresponding to the host interface mode change command is a first host interface mode having a data transmission speed slower than a set data transmission speed, and
    the normal write mode is selected when the host interface mode corresponding to the host interface mode change command is a second host interface mode having a data transmission speed faster than the set data transmission speed.

15. The method of claim 11, wherein the memory blocks included in the OS storage area are memory blocks that are programmed and read using an SLC method.

16. The method of claim 11, wherein the normal memory blocks are memory blocks that are programmed and read using an MLC, TLC, or QLC method.

\* \* \* \* \*